United States Patent
Yeo

(10) Patent No.: US 10,057,996 B2
(45) Date of Patent: Aug. 21, 2018

(54) FOLDABLE PORTABLE TERMINAL DEVICE

(71) Applicant: Samsung Display Co., Ltd., Yongin-si, Gyeonggi-do (KR)

(72) Inventor: Gilhwan Yeo, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 22 days.

(21) Appl. No.: 15/351,343

(22) Filed: Nov. 14, 2016

(65) Prior Publication Data

US 2017/0142848 A1   May 18, 2017

(30) Foreign Application Priority Data

Nov. 13, 2015   (KR) .................. 10-2015-0159699

(51) Int. Cl.
| | |
|---|---|
| *G06F 1/16* | (2006.01) |
| *H05K 5/00* | (2006.01) |
| *H05K 1/02* | (2006.01) |
| *H05K 5/02* | (2006.01) |
| *H05K 5/03* | (2006.01) |
| *G09F 9/30* | (2006.01) |

(52) U.S. Cl.
CPC ......... *H05K 5/0017* (2013.01); *G06F 1/1616* (2013.01); *G06F 1/1652* (2013.01); *G06F 1/1681* (2013.01); *G09F 9/301* (2013.01); *H05K 1/028* (2013.01); *H05K 5/0217* (2013.01); *H05K 5/03* (2013.01)

(58) Field of Classification Search
CPC .... G06F 1/1616; G06F 1/1652; G06F 1/1624; G06F 1/1637
See application file for complete search history.

(56) References Cited

U.S. PATENT DOCUMENTS

| | | | |
|---|---|---|---|
| 5,664,682 A | 9/1997 | Eren | |
| 6,016,176 A * | 1/2000 | Kim | ................. G02F 1/133305 349/158 |
| 8,300,416 B2 * | 10/2012 | Yang | ...................... G06F 1/162 361/679.01 |

(Continued)

FOREIGN PATENT DOCUMENTS

| | | |
|---|---|---|
| KR | 10-2013-0084102 A | 7/2013 |
| KR | 10-2014-0091276 A | 7/2014 |

(Continued)

*Primary Examiner* — Hoa C Nguyen
*Assistant Examiner* — Christopher L Augustin
(74) *Attorney, Agent, or Firm* — Knobbe Martens Olson & Bear LLP

(57) ABSTRACT

A foldable portable terminal device is disclosed. In one aspect, the device includes a flexible display configured to display an image and a foldable body accommodating the flexible display on a front side thereof. The device also includes first and second guide members disposed on opposing sides of the flexible display, wherein the first and second guide members are disposed on the front side of the body and extend in a length direction of the body. A first region of the body is configured to be folded so as to face a second region of the body. The first and second guide members are configured to guide an end of the first region to move in the length direction of the body while maintaining a predetermined interval with respect to the second region.

20 Claims, 13 Drawing Sheets

(56) References Cited

U.S. PATENT DOCUMENTS

| | | | | |
|---|---|---|---|---|
| 8,629,848 B2* | 1/2014 | Tani | ............... | G06F 1/1622 |
| | | | | 345/173 |
| 2002/0104769 A1 | 8/2002 | Kim et al. | | |
| 2005/0041381 A1* | 2/2005 | Maskatia | ............... | G06F 1/1616 |
| | | | | 361/679.06 |
| 2005/0128686 A1* | 6/2005 | Pihlaja | ............... | G06F 1/1624 |
| | | | | 361/679.01 |
| 2006/0002066 A1* | 1/2006 | Doczy | ............... | G06F 1/1616 |
| | | | | 361/679.09 |
| 2008/0180892 A1* | 7/2008 | Lai | ............... | G06F 1/1616 |
| | | | | 361/679.09 |
| 2010/0265686 A1* | 10/2010 | Kilpinen | ............... | G06F 1/1616 |
| | | | | 361/807 |
| 2012/0162889 A1* | 6/2012 | Han | ............... | G06F 1/162 |
| | | | | 361/679.09 |
| 2012/0175478 A1* | 7/2012 | Chen | ............... | G06F 1/1624 |
| | | | | 248/286.1 |
| 2014/0196253 A1 | 7/2014 | Song et al. | | |
| 2014/0226275 A1* | 8/2014 | Ko | ............... | G06F 1/1626 |
| | | | | 361/679.27 |
| 2014/0285476 A1 | 9/2014 | Cho et al. | | |
| 2015/0124388 A1* | 5/2015 | Shen | ............... | G06F 1/1616 |
| | | | | 361/679.09 |
| 2015/0212549 A1* | 7/2015 | Shin | ............... | G02F 1/133308 |
| | | | | 361/679.26 |
| 2016/0070304 A1* | 3/2016 | Shin | ............... | H04M 1/0268 |
| | | | | 361/679.26 |
| 2016/0098120 A1* | 4/2016 | Miyake | ............... | G06F 3/044 |
| | | | | 345/174 |

FOREIGN PATENT DOCUMENTS

| | | | |
|---|---|---|---|
| KR | 10-2014-0101295 A | 8/2014 | |
| KR | 10-2014-0115913 A | 10/2014 | |

* cited by examiner

FOLDABLE PORTABLE TERMINAL DEVICE

CROSS-REFERENCE TO RELATED APPLICATION

This application claims the benefit of Korean Patent Application No. 10-2015-0159699 on Nov. 13, 2015, in the Korean Intellectual Property Office, the disclosure of which is incorporated herein in its entirety by reference.

BACKGROUND

Field

The described technology generally relates to a foldable portable terminal device.

Description of the Related Technology

Portable electronic devices (hereinafter, referred to as portable terminal devices) such as a communication terminal, a game machine, a multimedia device, a portable computer, a photographing apparatus include a display panel that displays video information and an input unit such as a keypad.

Research and development is being actively conducted on portable terminal devices which are deformable according to the stage of use, for example, being folded, being rolled, or being stretched. Since such devices can take on various sizes, both a demand for an increase in the size of a display and a demand for a reduction in the size of a display can be satisfied.

These devices can not only be deformed into a preset form but also various other forms in response to a user's request or according to the circumstances dictated by usage. However, changes in mechanical structure caused by deformation may introduce a reduction in performance of the display or damage the quality of the generated images.

SUMMARY OF CERTAIN INVENTIVE ASPECTS

One inventive aspect relates to a portable terminal device which is foldable in various forms in order to enhance portability and adjust the size of a screen thereof and which is prevented from being folded with a radius of curvature equal to or less than a predetermined radius of curvature in order to prevent damage.

Another aspect is a portable terminal device which can prevent fragments, generated during the folding of the portable terminal device or during the deformation of the portable terminal device in a folded state, from being scattered to the outside of the portable terminal device.

Another aspect is a foldable portable terminal device that includes a flexible display displaying an image; a body on which the flexible display is mounted on a front side thereof and which is bent and foldable in a vertical direction; and first and second guide members disposed outside the flexible display in a horizontal direction. In a state where a first region of the body is folded so as to face a second region of the body, the first and second guide members guide an end of the first region so that the end is moved in a vertical direction while maintaining a predetermined interval with respect to the second region.

The device may further include a transparent protection layer disposed on a front side of the flexible display.

The transparent protection layer may include tempered glass.

A thickness of the transparent protection layer may be equal to or less than 100 um.

Each of the first and second guide members may include a plurality of rollers that are arranged along the vertical direction.

The rollers may be disposed so as to protrude forward from a surface of the body.

Each of the first and second guide members may include a projection which is disposed at one end of the body in a vertical direction and protrudes forward from a surface of the body, and a guide portion which extends in the vertical direction and guides the projection so that the projection is moved along the vertical direction.

The device may further include a scattering prevention portion disposed at one end of the body, extending in a horizontal direction, and protruding from a surface of the body.

A folded portion of the portable terminal device may be variable.

Another aspect is a foldable portable terminal device that includes a flexible display displaying an image; a body which is mounted with the flexible display on a front side thereof and which is bent and foldable in a vertical direction; a transparent protection layer which is disposed on a front side of the flexible display, is foldable, and includes tempered glass; and a scattering prevention portion disposed at a lower end of the body so as to extend in a horizontal direction and protruding from a surface of the body.

A thickness of the transparent protection layer may be equal to or less than 100 um.

The device may further include first and second guide members disposed outside the flexible display in a horizontal direction. In a state where a first region of the body is folded so as to face a second region of the body, the first and second guide members guide an end of the first region so that the end is moved in a vertical direction while maintaining a predetermined interval with respect to the second region.

Each of the first and second guide members may include a plurality of rollers that are arranged along the vertical direction.

The rollers may be disposed so as to protrude forward from a surface of the body.

Each of the first and second guide members may include a projection which is disposed at one end of the body in a vertical direction and protrudes forward from a surface of the body, and a guide portion which extends in the vertical direction and guides the projection so that the projection is moved along the vertical direction.

A folded portion of the portable terminal device may be variable.

General and specific aspects may be implemented using a system, a method, a computer program, or any combination of a system, a method, and a computer program.

Another aspect is a foldable portable terminal device comprising: a flexible display configured to display an image; a foldable body accommodating the flexible display on a front side thereof; and first and second guide members disposed on opposing sides of the flexible display, wherein the first and second guide members are disposed on the front side of the body and extend in a length direction of the body, wherein a first region of the body is configured to be folded so as to face a second region of the body, and wherein the first and second guide members are configured to guide an end of the first region to move in the length direction of the body while maintaining a predetermined interval with respect to the second region.

The above device further comprises: a transparent protection layer disposed on a front side of the flexible display.

In the above device, the transparent protection layer is formed of tempered glass. In the above device, the transparent protection layer has a thickness that is less than or equal to 100 µm. In the above device, each of the first and second guide members comprises a plurality of rollers that are arranged along the length direction. In the above device, the rollers protrude from the front side of the body in the depth dimension of the terminal device.

In the above device, each of the first and second guide members comprises a projection which is disposed at one end of the front side of the body and protrudes from the front side of the body in the depth dimension of the terminal device, and a guide portion which extends in the length direction and guides the projection to move along the length direction. The above device further comprises: scattering prevention portion disposed at one end of the front side of the body and extending in a width direction of the body, wherein the scattering prevention portion protrudes from the front side of the body in the depth dimension of the terminal device. In the above device, the body and the flexible display are foldable anywhere along the front side of the body.

Another aspect is a foldable portable terminal device comprising: a flexible display configured to display an image; a foldable body accommodating the flexible display on a front side thereof; a foldable transparent protection layer which is disposed on a front side of the flexible display and formed of tempered glass; and a scattering prevention portion disposed at a lower end of the front side of the body and extending in a width direction of the body, wherein the scattering prevention portion protrudes from the front side of the body in the depth dimension of the terminal device.

In the above device, the transparent protection layer has a thickness that is less than or equal to 100 µm. The above device further comprises: first and second guide members disposed on opposing sides of the flexible display, wherein the first and second guide members are disposed on the front side of the body and extend in a length direction of the body, wherein a first region of the body is configured to be folded so as to face a second region of the body, and wherein the first and second guide members are configured to guide an end of the first region to move in the length direction of the body while maintaining a predetermined interval with respect to the second region. In the above device, each of the first and second guide members comprises a plurality of rollers that are arranged along the length direction of the body.

In the above device, the rollers protrude from the front side of the body in the depth dimension of the terminal device. In the above device, each of the first and second guide members comprises a projection which is disposed at one end of front side of the body and protrudes from the front side of the body in the depth dimension of the terminal device., and a guide portion which extends in the length direction of the body and guides the projection to move along the length direction. In the above device, the body and the flexible display are foldable anywhere along the front side of the body.

Another aspect is a foldable portable terminal device comprising: a flexible display panel; a foldable body accommodating the flexible display panel on a front side thereof; and first and second guide members disposed on opposing sides of the flexible display panel, wherein the first and second guide members are disposed on the front side of the body and extend in a length direction of the body, wherein a first region of the body is configured to be folded so as to face a second region of the body, and wherein an end of the first region does not contact the second region when the first region of the body is folded toward the second region.

In the above device, the end of the first region extends in the depth dimension of the terminal device. In the above device, the first and second guide members are configured to guide the end of the first region to move in the length direction. In the above device, each of the first and second guide members comprises a plurality of rollers that are arranged along the length direction.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

Figure 1A:
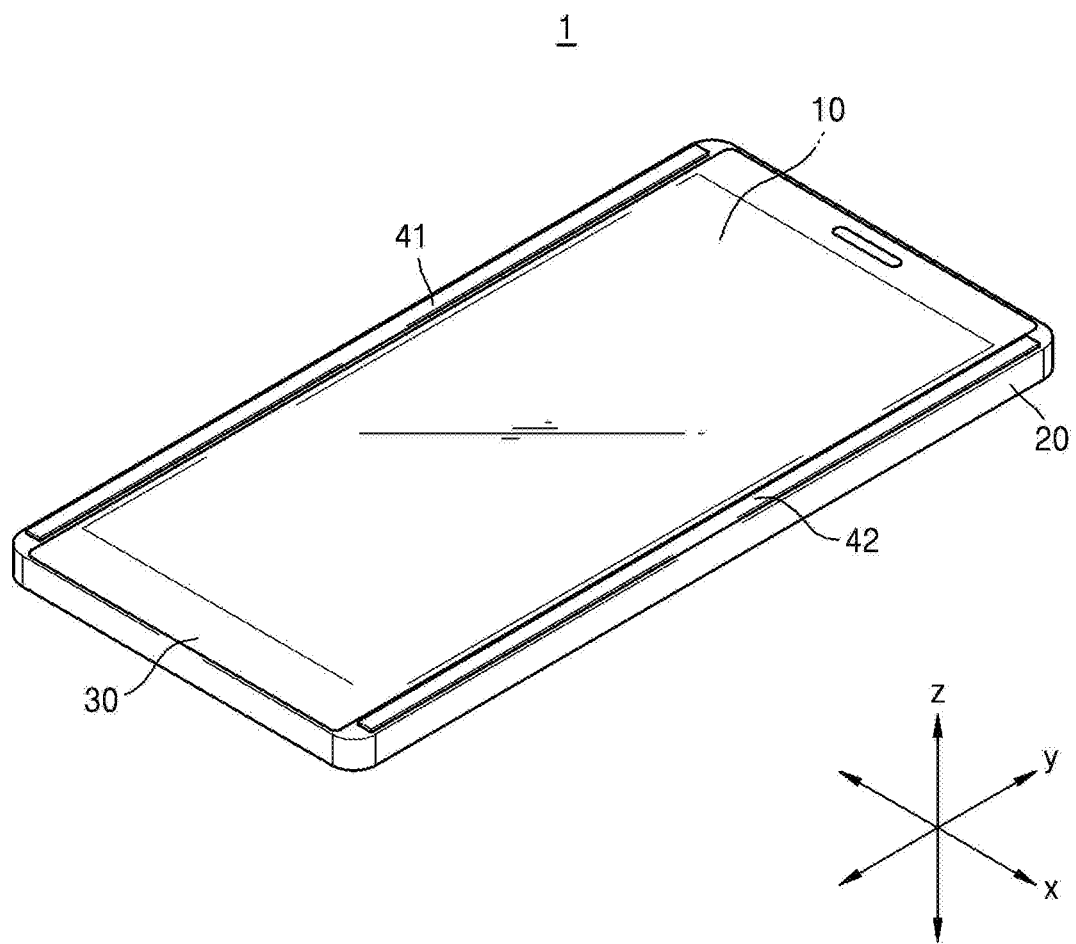
FIG. 1A is a schematic combined perspective view illustrating a portable terminal device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In the following embodiments, terms such as 'first', 'second', etc. are used to describe various elements. However, it is obvious that the elements should not be defined by these terms. The terms are used only for distinguishing one element from another element.

In the following embodiments, the singular forms "a," "an" and "the" are intended to include the plural forms as well, unless the context clearly indicates otherwise.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Figure 1B:
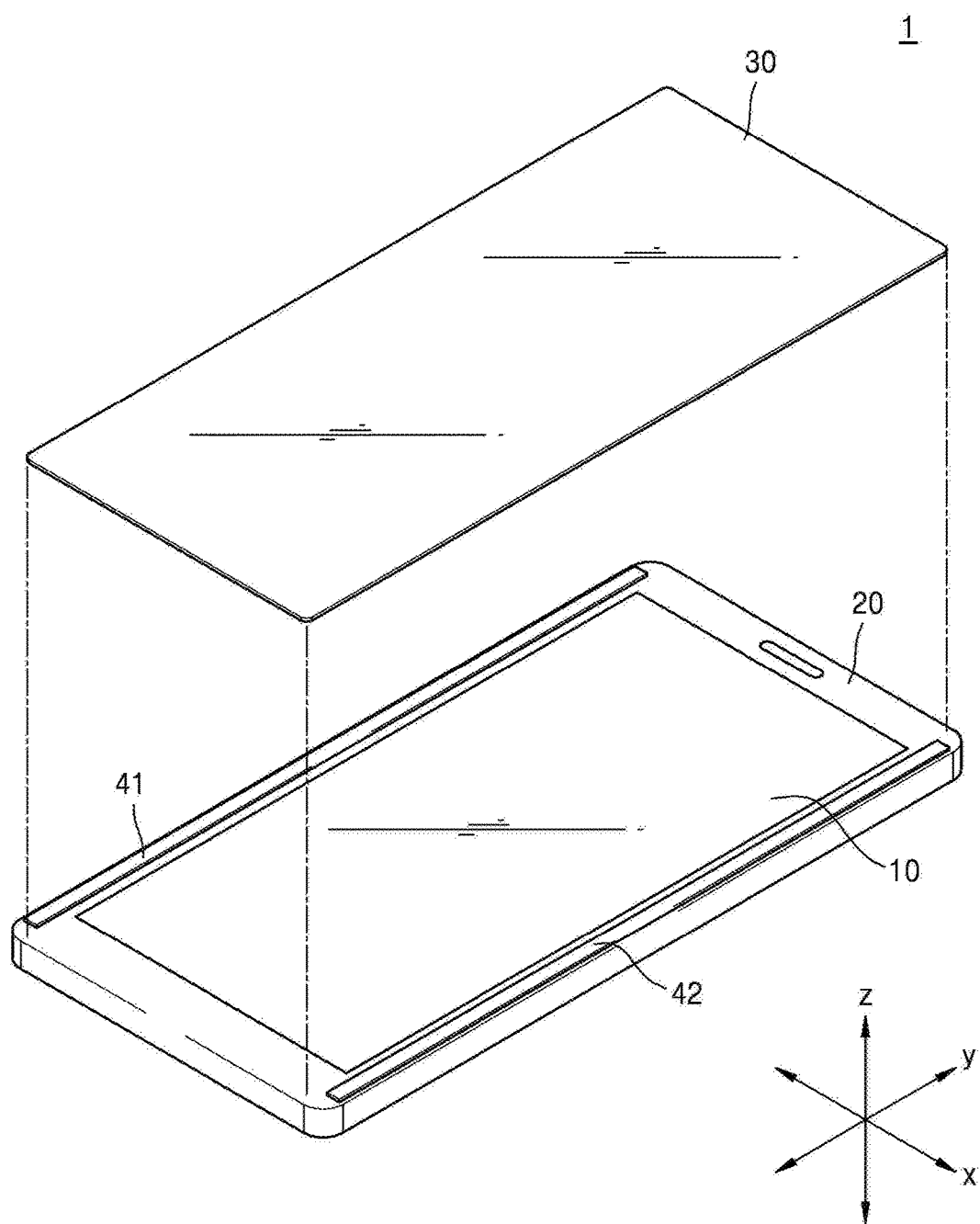
FIG. 1B is a schematic exploded perspective view illustrating the portable terminal device according to the embodiment.

FIG. 1A is a schematic combined perspective view illustrating a portable terminal device 1 according to an embodiment. FIG. 1B is a schematic exploded perspective view illustrating the portable terminal device 1 according to the embodiment.

Referring to FIGS. 1A and 1B, the portable terminal device 1 includes a flexible display 10 and a body 20. The portable terminal device 1 further includes a transparent protection layer 30 which is disposed on the front side of the flexible display 10.

The portable terminal device 1 may be a portable mobile device such as a communication terminal, a game machine, a multimedia device, a portable computer, a photographing apparatus. In addition, the portable terminal device 1 may be any device insofar as the portable terminal device is foldable.

The flexible display 10 displays an image. The flexible display 10 is mounted on the front side of the body 20. The flexible display 10 may include, for example, an organic light-emitting diode (OLED) structure. However, the flexible display 10 is not limited to having the OLED structure, and may include another structure, for example, a liquid crystal display (LCD) structure.

The flexible display 10 may further have a touch screen function. Although not shown in the drawing, the flexible display 10 may further include, for example, a touch panel (not shown).

Another component for driving the portable terminal device 1 may be accommodated or disposed in the body 20. Although not shown in the drawing, for example, a processing unit (not shown), a printed circuit board (not shown), a battery (not shown), and the like that perform functions according to the use of the portable terminal device 1 may be accommodated in the body 20, and an input unit (not shown) or an output unit (not shown) of the portable terminal device 1 may be disposed outside the body 20.

The transparent protection layer 30 may be disposed on the front side of the flexible display 10. A user may confirm an image which is displayed on the flexible display 10 through the transparent protection layer 30.

The thickness of the transparent protection layer 30 may be equal to or less than about 100 um. Here, the thickness of the transparent protection layer 30 will be defined as a thickness in a front-back direction (z-direction). The transparent protection layer 30 may include a glass material. For example, the transparent protection layer 30 may be formed of tempered glass. The tempered glass having a strength higher than that of general glass may have a Mohs hardness of equal to or greater than 7, but is not limited thereto. In the portable terminal device 1, tempered glass is used for the transparent protection layer 30, thereby improving a writing sense.

Figure 2:
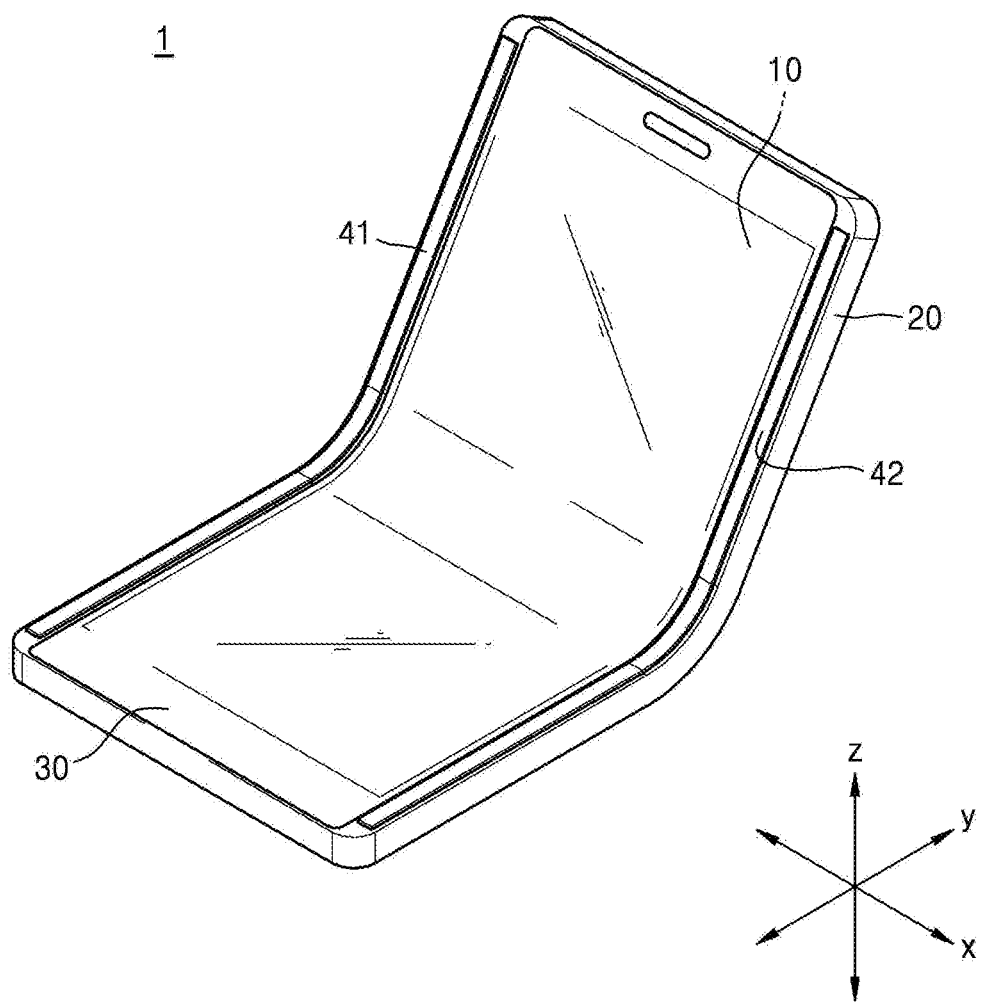
FIG. 2 is a diagram illustrating a state where the portable terminal device according to the embodiment is folded.
Figure 3:
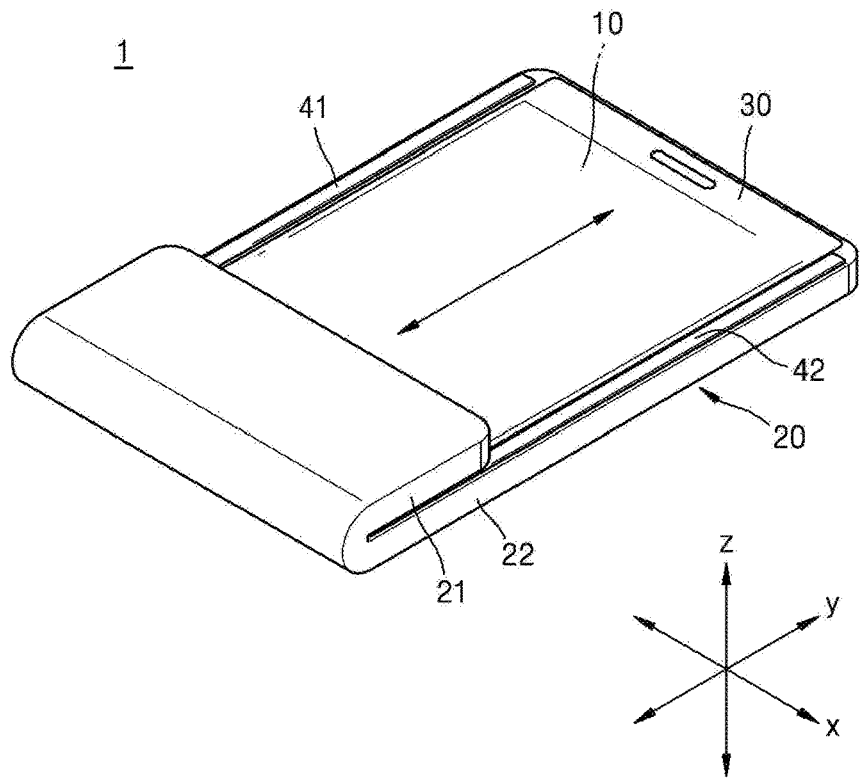
FIG. 3 is a diagram illustrating the portable terminal device according to the embodiment which is foldable in a vertical direction.
Figure 4:
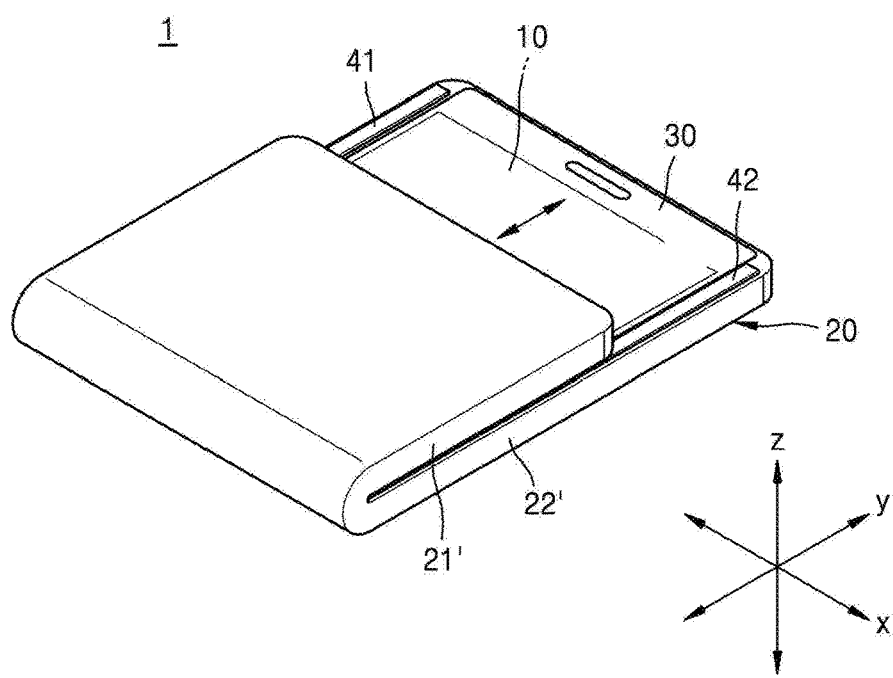
FIG. 4 is a diagram illustrating the portable terminal device according to the embodiment which is slidable in a folded state.

FIG. 2 is a diagram illustrating a state where the portable terminal device 1 according to the embodiment is folded. FIG. 3 is a diagram illustrating the portable terminal device 1 according to the embodiment which is foldable in a vertical direction (y-direction). FIG. 4 is a diagram illustrating the portable terminal device 1 according to the embodiment which is slidable in a folded state.

Referring to FIG. 2, the portable terminal device 1 may be folded. For example, the flexible display 10, the body 20, and the transparent protection layer 30 may be folded in a first direction, for example, the vertical direction or a length direction of the body 20 (y-direction). A folded portion of the portable terminal device 1 may be variable. For example, the portable terminal device 1 may be not only folded centering on a central portion in the vertical direction (y-direction) but also folded centering on a portion below or above the central portion.

Referring to FIG. 3, the portable terminal device 1 may be bent and folded. A portion of the portable terminal device 1 may overlap another portion thereof. For example, the flexible display 10, the body 20, and the transparent protection layer 30 may be bent and folded in the vertical direction (y-direction).

The portable terminal device 1 may be folded so that one end of the portable terminal device 1 faces the other portion of the portable terminal device 1. For example, the flexible display 10, the body 20, and the transparent protection layer 30 may be folded so that an end of a first region 21 of the body 20 faces a second region 22 of the body 20. A portion of the portable terminal device 1, which is bent and folded, may be variable.

Referring to FIG. 4, the portable terminal device 1 may be slidingly moved in a folded state. Accordingly, in a state where the portable terminal device 1 is folded, a user may freely adjust the size of the flexible display 10 which is exposed to the environment. The portable terminal device 1 is slidingly moved in a folded state, and thus the size of a first region 21' of the body 20 and the size of a second region 22' of the body 20 are changed. The size of a region in which the first region 21' and the second region 22' of the body 20 overlap each other may be changed.

Figure 5A:
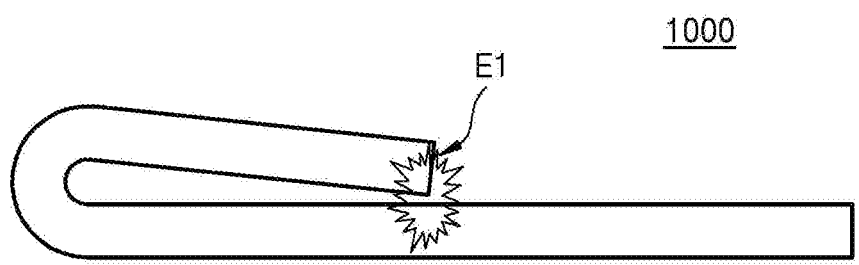
FIG. 5A is a diagram illustrating a portable terminal device according to a comparative example.
Figure 5B:
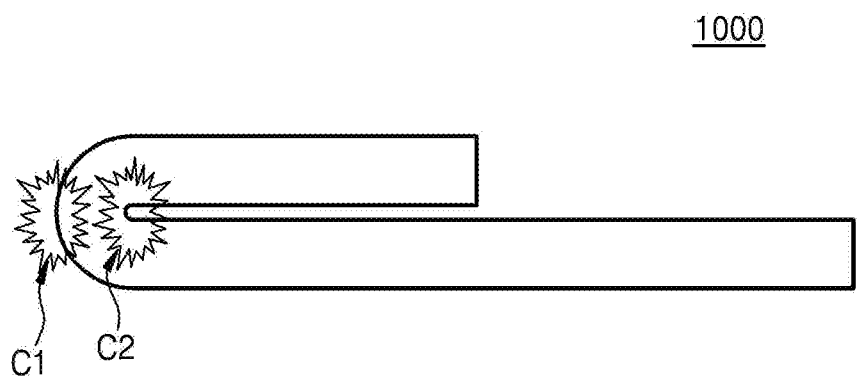
FIG. 5B is a diagram illustrating a portable terminal device according to a comparative example.

However, when the portable terminal device 1 is slidingly moved during the folding of the portable terminal device 1 or in a folded state thereof, it is necessary to pay attention to damage to the portable terminal device 1. For example, as illustrated in FIG. 5A, one end E1 of a portable terminal device 1000 may collide with the other portion of a portable terminal device 1000 and may be damaged. For example, as illustrated in FIG. 5B, when an external force is applied to the portable terminal device 1000 in a state where the portable terminal device 1000 is folded, a folded region has a radius of curvature less than a predetermined radius of curvature at which the portable terminal device 1000 can be folded, which may raise a concern of damage to an inner side C2 or an outer side C1 of the folded region of the portable terminal device 1000.

Referring back to FIGS. 1A and 1B to FIG. 4, the portable terminal device 1 may further include first and second guide members 41 and 42 in consideration of damage that may occur during the folding of the portable terminal device 1 or the slidingly moving in a folded state thereof.

The first and second guide members 41 and 42 may be disposed outside the flexible display 10 in the horizontal direction or a width direction of the body 20 (x-direction). In a state where the first region 21 of the body 20 is folded so as to face the second region 22 of the body 20, the first and second guide members 41 and 42 may guide an end of the first region 21 so that the end is moved in the vertical direction (y-direction) while maintaining a predetermined interval with respect to the second region 22.

Since the predetermined interval between the end of the first region 21 of the body 20 and the second region 22 is maintained by the first and second guide members 41 and 42, it is possible to prevent the end of the first region 21 of the body 20 from coming into contact with the second region 22. In addition, since the predetermined interval between the first region 21 of the body 20 and the second region 22 is maintained by the first and second guide members 41 and 42, it is possible to support the folded region so as not to be folded with less than a predetermined radius of curvature. Here, the wording "radius of curvature" refers to the degree of bending of a circle having the radius.

For example, it is possible to prevent a radius of curvature of the folded portion of the transparent protection layer 30 from being set to less than 1 mm by the first and second guide members 41 and 42.

Figure 6:
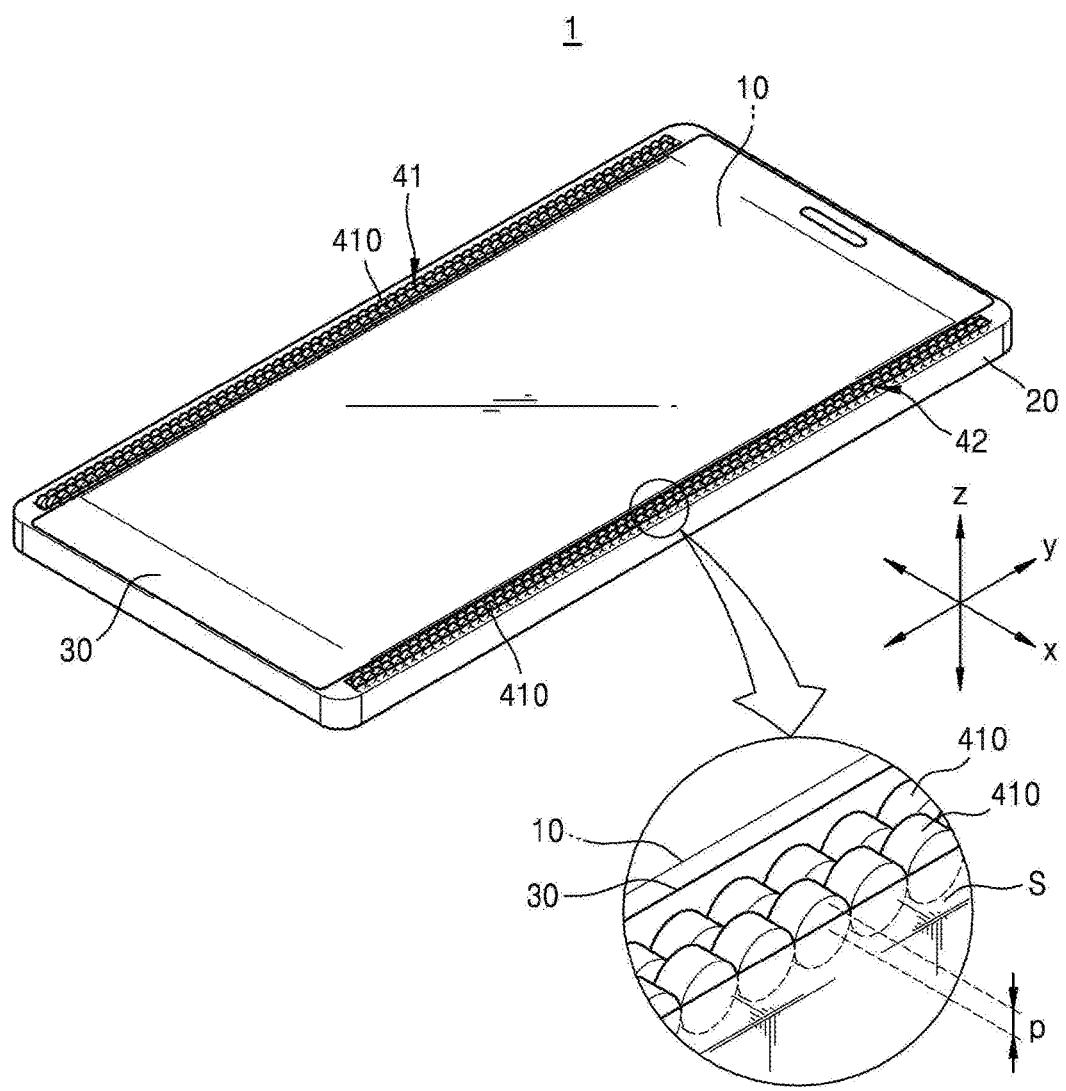
FIG. 6 is a perspective view illustrating an example of the portable terminal device and is a diagram illustrating an example of first and second guide members.
Figure 7:
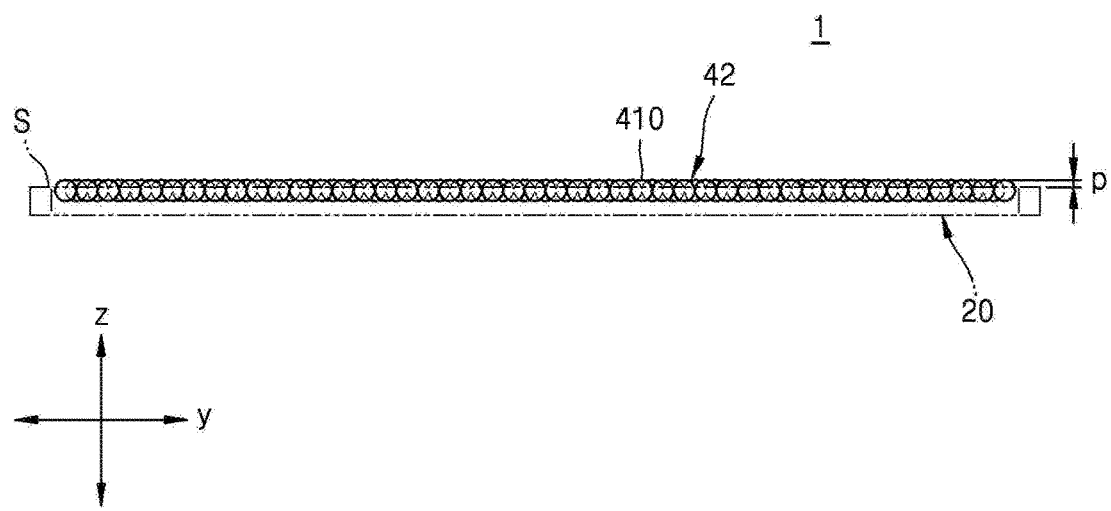
FIG. 7 is a side view of the portable terminal device illustrated in FIG. 6.
Figure 8A:
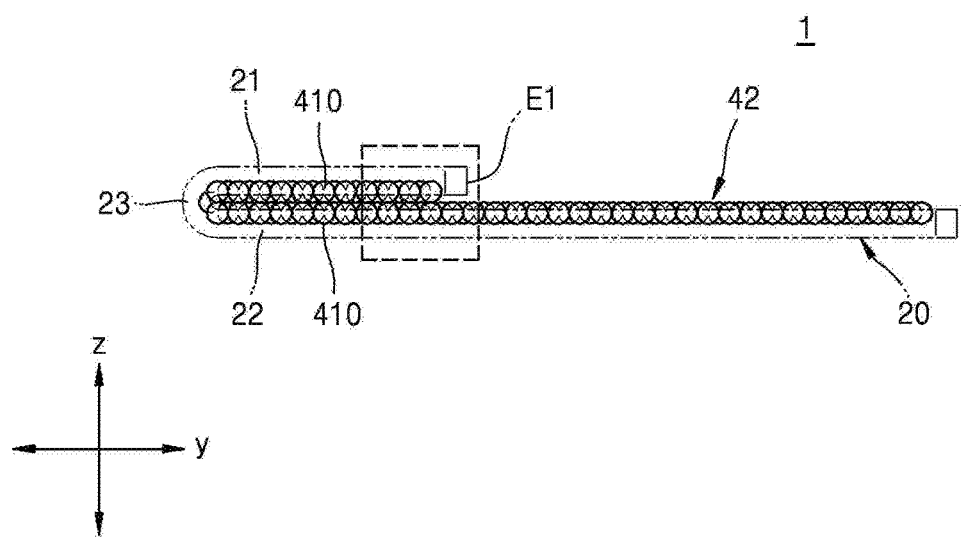
FIG. 8A is a diagram illustrating the portable terminal device illustrated in FIG. 7 which is slid in a folded state.
Figure 8B:
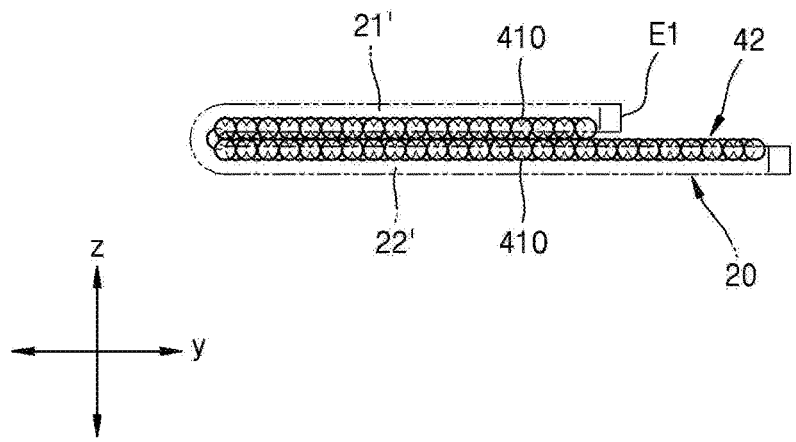
FIG. 8B is a diagram illustrating the portable terminal device illustrated in FIG. 7 which is slid in a folded state.
Figure 9:
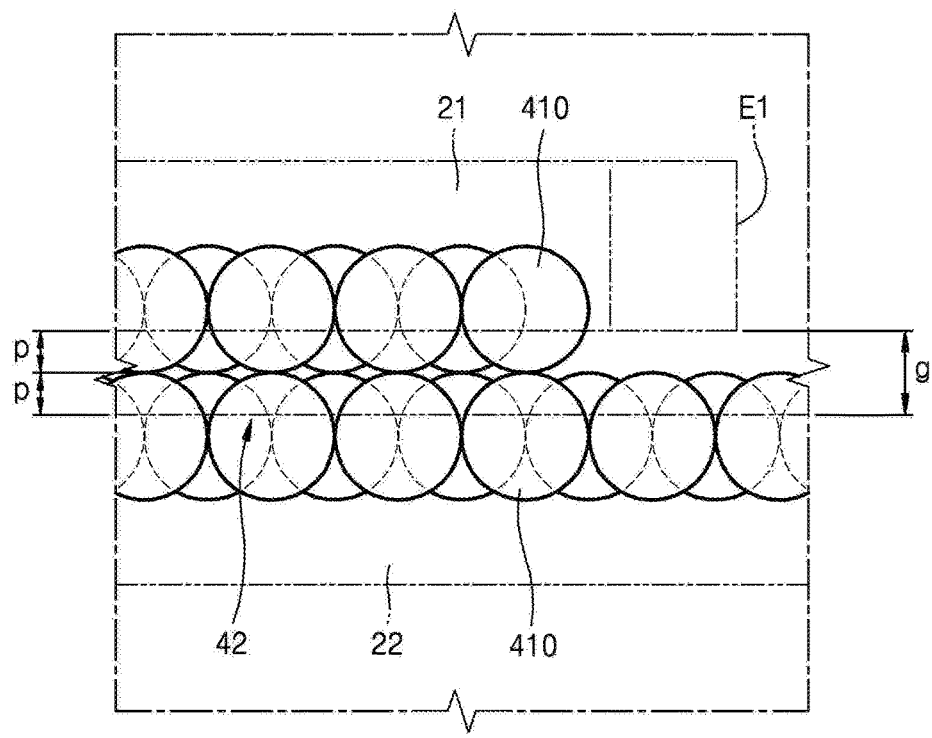
FIG. 9 is a partially enlarged view of the portable terminal device illustrated in FIG. 8A.

FIG. 6 is a perspective view illustrating an example of the portable terminal device 1 and is a diagram illustrating an example of the first and second guide members 41 and 42. FIG. 7 is a side view of the portable terminal device 1 illustrated in FIG. 6. FIG. 8A is a diagram illustrating the portable terminal device 1 illustrated in FIG. 7 which is slid in a folded state. FIG. 8B is a diagram illustrating the portable terminal device 1 illustrated in FIG. 7 which is slid in a folded state. FIG. 9 is a partially enlarged view of the portable terminal device 1 illustrated in FIG. 8A.

Referring to FIG. 6, each of the first and second guide members 41 and 42 of the portable terminal device 1 according to the embodiment includes a plurality of rollers 410 that are arranged along the vertical direction (y-direction). For example, in each of the first and second guide members 41 and 42, the rollers 410 are arranged in two rows.

Referring to FIGS. 6 and 7, the rollers 410 may be arranged so as to protrude forward from a surface S of the body 20. The surface S of the body 20 may conform to the surface of the transparent protection layer 30. A protrusion thickness p of the roller 410 may be designed in consideration of a radius of curvature at which the portable terminal device 1 can be folded without damaging the portable terminal device 1. For example, the protrusion thickness p of the roller 410 may be equal to or greater than a radius of curvature at which the transparent protection layer 30 can be folded. When the radius of curvature capable of folding the transparent protection layer 30 is about 1 mm, the protrusion thickness p of the roller 410 may be about 1 mm or greater.

The rollers 410 arranged in two rows may be alternately arranged. For this reason, when the first region 21 of the body 20 is slidingly moved in the vertical direction (y-direction) with respect to the second region 22, the first region 21 may be smoothly moved.

Referring to FIGS. 8A and 9, the rollers 410 in the first region 21 come into contact with the rollers 410 in the second region 22 in a state where the body 20 is folded. Accordingly, it is possible to a predetermined interval g between the end E1 of the first region 21 and the second region 22.

For example, when it is assumed that a protrusion height p of each of the rollers 410, arranged in the first and second regions 21 and 22 of the body 20, which protrude from the surface of the body 20 is about 1 mm, the first region 21 may maintain an interval of about 2 mm with respect to the second region 22. The end of the first region 21 may maintain an interval of about 2 mm with respect to the second region 22.

In addition, a predetermined radius of curvature of a folded region 23 between the first and second regions 21 and 22 of the body 20 may be maintained by the rollers 410. Accordingly, it is possible to prevent the transparent protection layer 30 of the portable terminal device 1 from being folded with less than a predetermined radius of curvature at which the transparent protection layer 30 can be folded. For example, it is possible to prevent the transparent protection layer 30 of the portable terminal device 1 from being folded with a radius of curvature of less than about 1 mm by contact between the rollers 410 protruding from the surface S of the body 20 by about 1 mm.

Referring to FIG. 8B, when a user moves at least one of the first and second regions 21 and 22 of the body 20 in a state where the portable terminal device 1 is folded so as to maintain a predetermined interval between the two regions 21 and 22, the first region 21' of the body 20 may be moved with respect to the second region 22' in the vertical direction (y-direction) by contact between and rotation of the rollers 410.

Meanwhile, in the above-described embodiment, a description has been given focusing on the fact that the rollers 410 of the first and second guide members 41 and 42 are arranged in two rows, but the present disclosure is not limited thereto. Although not shown in the drawing, for example, the rollers 410 of the first and second guide members 41 and 42 may be arranged in a row or in three or more rows.

Figure 10:
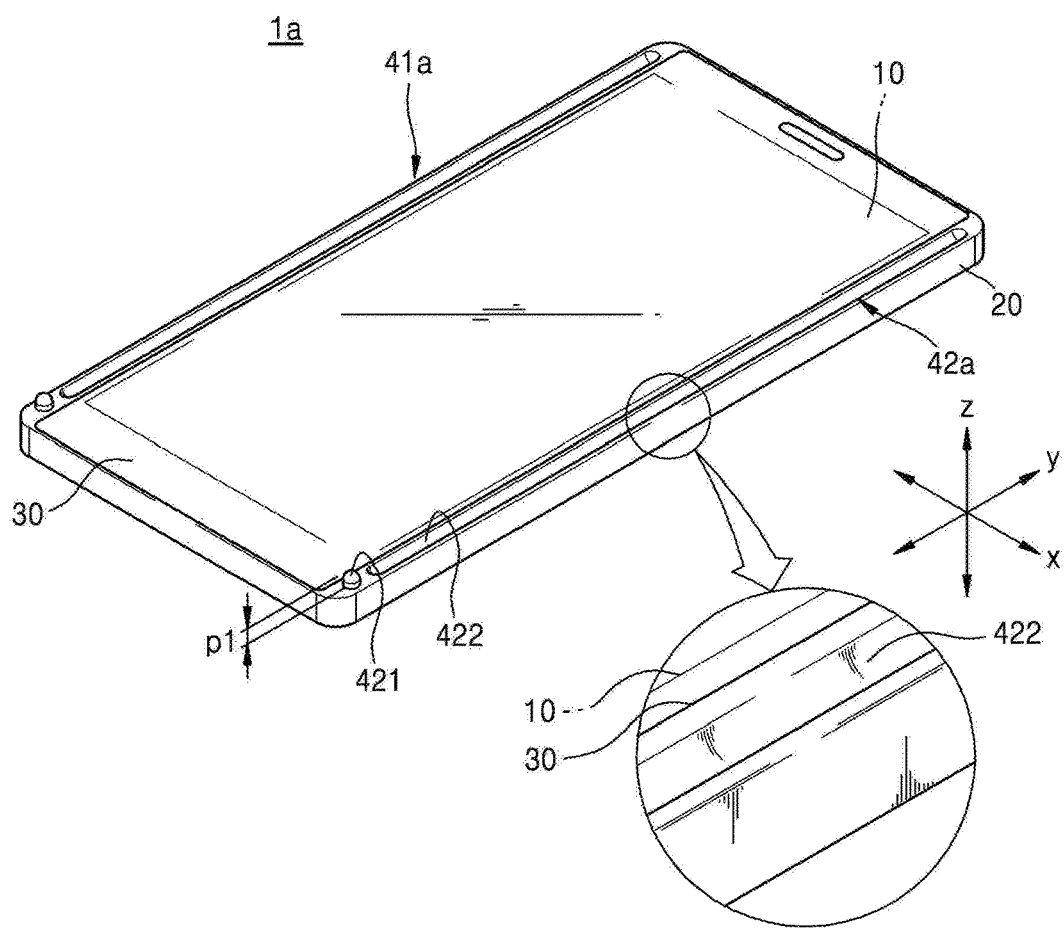
FIG. 10 is a perspective view of a portable terminal device according to another embodiment and is a diagram illustrating another example of first and second guide members.
Figure 11:
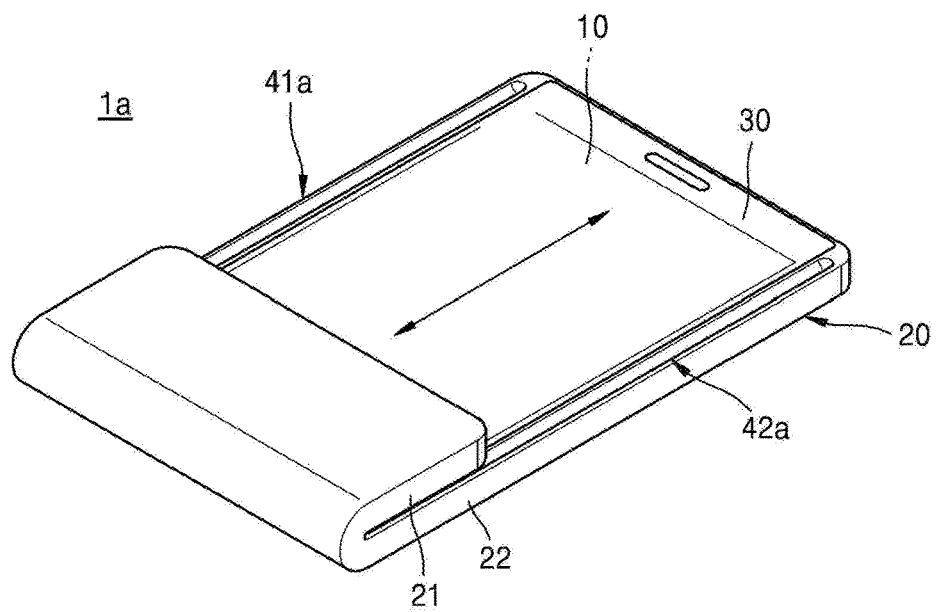
FIG. 11 is a diagram illustrating the portable terminal device illustrated in FIG. 10 which is slid in a folded state.
Figure 12A:
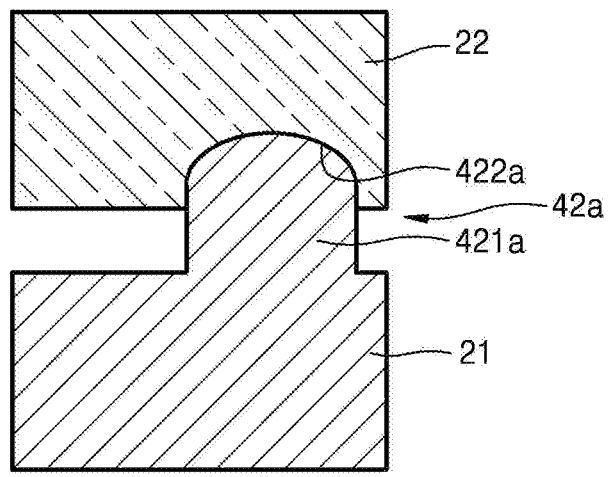
FIG. 12A is a diagram illustrating a projection and a guide portion according to another embodiment.
Figure 12B:
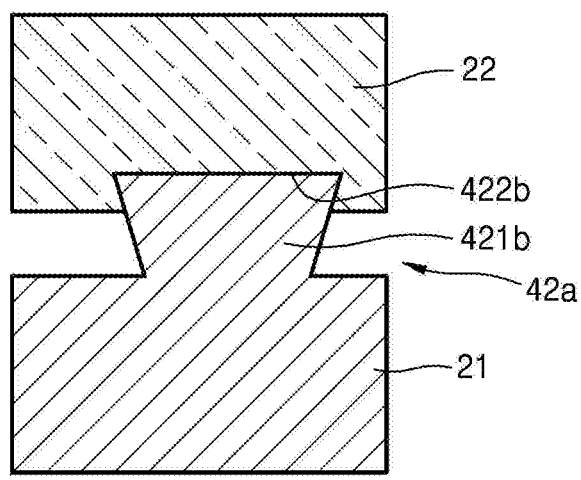
FIG. 12B is a diagram illustrating a projection and a guide portion according to another embodiment.
Figure 12C:
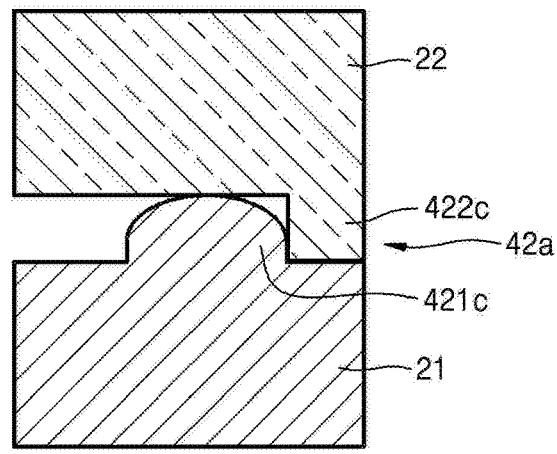
FIG. 12C is a diagram illustrating a projection and a guide portion according to another embodiment.

FIG. 10 is a perspective view of a portable terminal device 1a according to another embodiment and is a diagram illustrating another example of first and second guide members 41a and 42a. FIG. 11 is a diagram illustrating the portable terminal device 1a illustrated in FIG. 10 which is slid in a folded state. FIGS. 12A to 12C are diagrams illustrating a projection 421 and a guide portion 422 according to various embodiments.

Referring to FIGS. 10 and 11, each of the first and second guide members 41a and 42a includes the projection 421 and the guide portion 422.

The projection 421 may protrude forward from the surface of a body 20. A protrusion height p1 of the projection 421 may be twice or more a radius of curvature capable of folding the portable terminal device 1a.

The projection 421 may be disposed at one end of the body 20 in the vertical direction (y-direction). For example, the projection 421 may be disposed at both ends of a lower end of the body 20 in the horizontal direction (x-direction).

The guide portion 422 may extend in the vertical direction (y-direction). The guide portion 422 may guide the movement of the projection 421 in the vertical direction (y-direction) in a state where the body 20 is folded.

A cross-sectional shape of the guide portion 422 may correspond to a cross-sectional shape of at least a portion of the projection 421.

For example, the guide portion 422 may have a concave shape so that the cross-sectional shape of the guide portion 422 corresponds to the cross-sectional shape of the projection 421. As an example, as illustrated in FIG. 12A, a cross-sectional shape of a projection 421a may be a convex shape including a curve. As another example, as illustrated in FIG. 12B, a cross-sectional shape of a projection 421b may be a polygonal shape, for example, a trapezoidal shape, and a cross-sectional shape of a guide portion 422b may be a polygonal shape, for example, a trapezoidal shape.

However, the cross-sectional shape of the guide portion 422 does not have to necessarily correspond to the cross-sectional shape of the projection 421, and may be any of various shapes insofar as the guide portion 422 has a shape for guiding the projection 421. For example, when a projection 421c has a convex shape, a guide portion 422c may support one side of the projection 421c as illustrated in FIG. 12C. For example, as illustrated in FIG. 12C, the guide portion 422c of a second guide member 42a contacts and supports the right surface of the projection 421c of the second guide member 42. Although not shown in the drawing, the guide portion 422c of a first guide member 41a contacts and supports the left surface of the projection 421c of the first guide member 41. Accordingly, one end of the portable terminal device 1a may be slidingly moved in a direction parallel to the vertical direction (y-direction) with respect to the other portion of the portable terminal device 1a in a state where the portable terminal device 1a is folded by the first and second guide members 41a and 42a.

Figure 13:
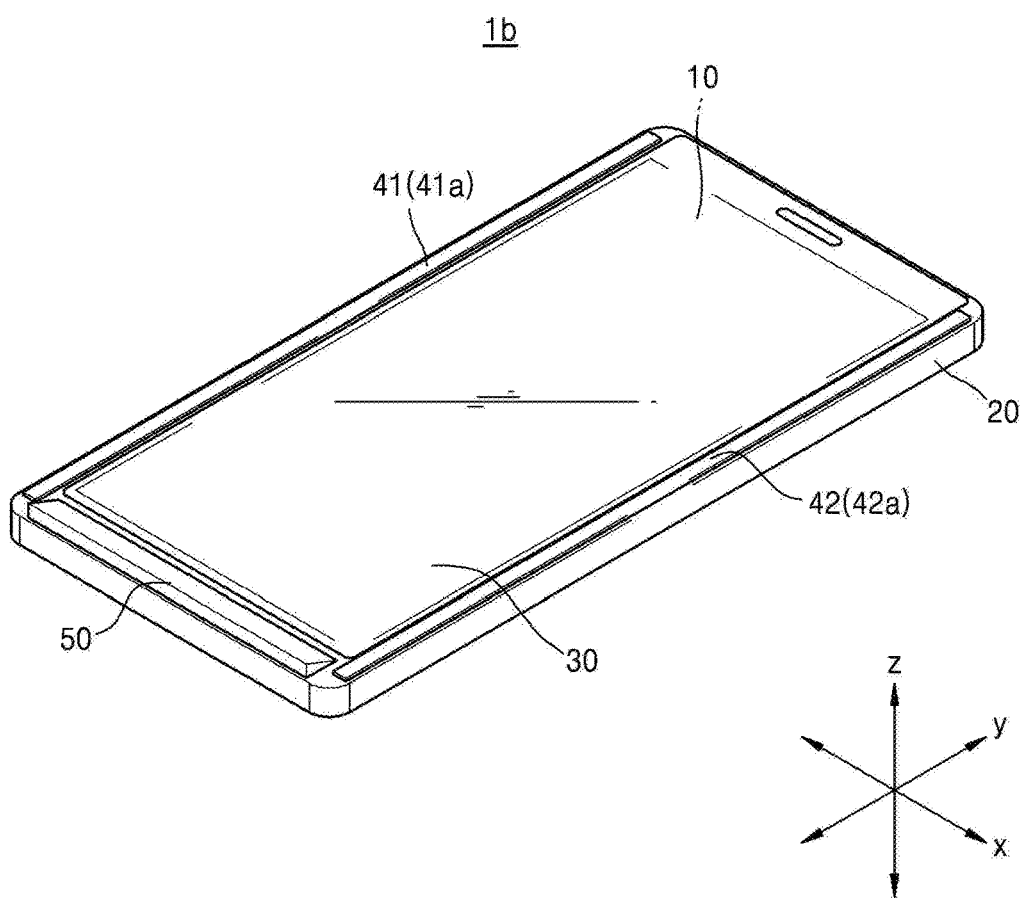
FIG. 13 is a perspective view of a portable terminal device according to another embodiment.
Figure 14:
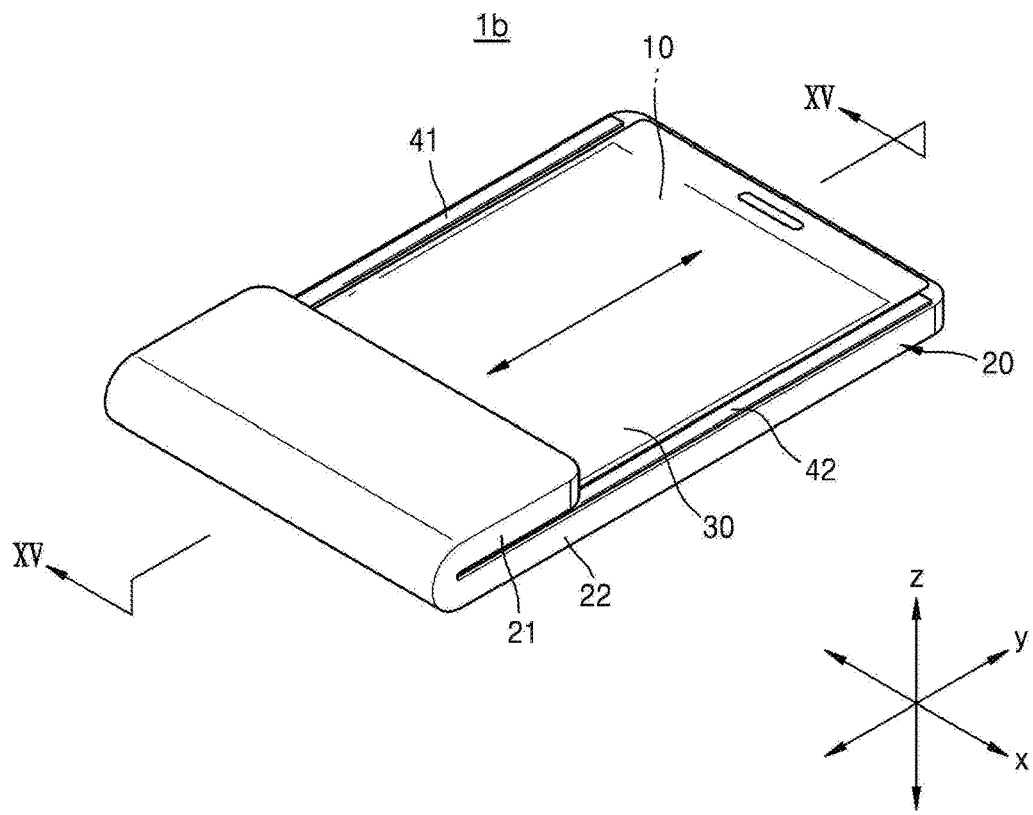
FIG. 14 is a diagram illustrating the portable terminal device illustrated in FIG. 13 which is folded.
Figure 15:
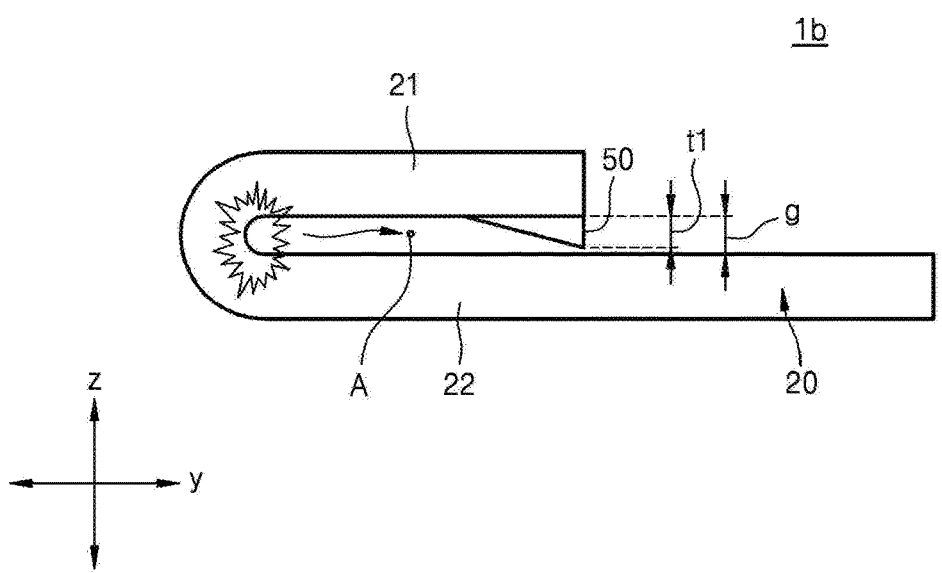
FIG. 15 is a cross-sectional view taken along line XV-XV of FIG. 14.

FIG. 13 is a perspective view of a portable terminal device 1b according to another embodiment. FIG. 14 is a diagram illustrating the portable terminal device 1b illustrated in FIG. 13 which is folded. FIG. 15 is a cross-sectional view taken along line XV-XV of FIG. 14.

Referring to FIGS. 13 and 14, the portable terminal device 1b includes a flexible display 10, a body 20, a transparent protection layer 30, and first and second guide members 41, 42, 41a, and 42a. The same components as those in the above-described embodiments are denoted by the same reference numerals and signs, and a repeated description will be omitted here.

The portable terminal device 1b according to the embodiment further includes a scattering prevention portion 50. The scattering prevention portion 50 may prevent fragments, which may be generated when the portable terminal device 1b is folded or a portion of the portable terminal device 1b is slidingly moved with respect to another portion in a folded state, from being scattered to the outside.

The scattering prevention portion 50 is disposed at one end of a body 20 and extends in the horizontal direction (x-direction). The scattering prevention portion 50 may protrude from the surface of the body 20.

Referring to FIG. 15, the scattering prevention portion 50 may block a gap between a first region 21 and a second region 22 of the body 20 which is folded. A thickness t1 of the scattering prevention portion 50 may be smaller than an interval g between the first region 21 and the second region 22 of the body 20. Here, the thickness t1 of the scattering prevention portion 50 may refer to a maximum thickness when the thickness of the scattering prevention portion 50 varies.

A transparent protection layer 30 disposed on the front side of the portable terminal device 1b may generate minute fragments during the folding of the portable terminal device 1b or during the sliding of the portable terminal device 1b in a folded state. For example, when the portable terminal device 1b is slid in a folded state, fragments A may be generated in a folded portion of the transparent protection layer 30. When the transparent protection layer 30 is formed of tempered glass, the fragments A may be scattered at a speed of several tens of km/h.

In the portable terminal device 1b according to the embodiment, since the scattering prevention portion 50 blocks a gap between the first region 21 and the second region 22, it is possible to prevent fragments generated from the transparent protection layer 30 from being scattered to the outside.

The scattering prevention portion 50 may have various cross-sectional shapes. For example, the scattering prevention portion 50 may have a thickness which gradually or continuously increases toward the outside.

Figure 16:
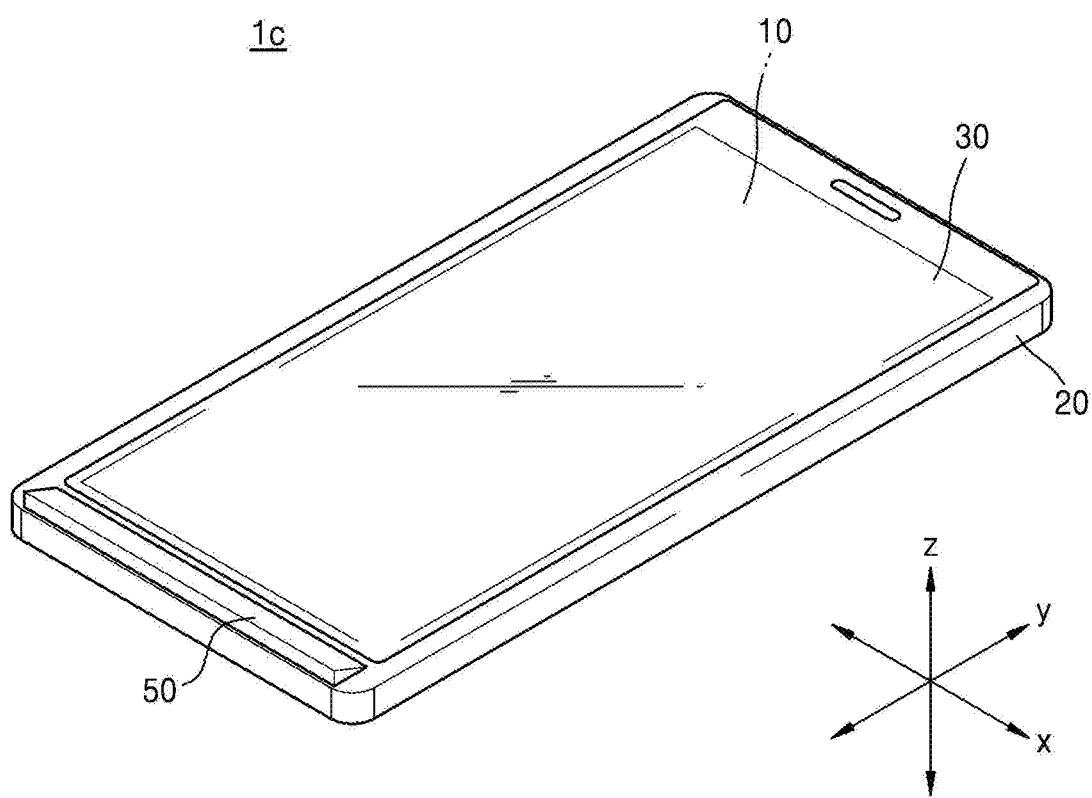
FIG. 16 is a perspective view of a portable terminal device according to another embodiment.

Meanwhile, in the above-described embodiment, a description has been given focusing on an example in which the portable terminal device 1b includes the scattering prevention portion 50 in a state where the portable terminal device 1b includes the first and second guide members 41 and 42. However, the described technology is not limited thereto, and the portable terminal device 1c may include a scattering prevention portion 50 without first and second guide members 41 and 42, as illustrated in FIG. 16.

The portable terminal device according to the present embodiment may be folded in various forms and may be prevented from being damaged.

The portable terminal device according to the present embodiment may prevent fragments, generated during the folding of the portable terminal device or during the deformation of the portable terminal device in a folded state, from being scattered to the outside.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A foldable portable terminal device comprising:
   a flexible display configured to display an image;
   a foldable body accommodating the flexible display on a front side thereof; and
   first and second guide members disposed on opposing sides of the flexible display, wherein the first and second guide members are disposed on the front side of the body,
   wherein a first region of the body is configured to be folded so as to face a second region of the body,
   wherein the first and second guide members are configured to guide an end of the first region to move in a length direction of the body while maintaining a predetermined interval with respect to the second region and,
   wherein the flexible display, the foldable body and the guide members are configured to be folded together.

2. The device of claim 1, further comprising:
   a transparent protection layer disposed on a front side of the flexible display.

3. The device of claim 2, wherein the transparent protection layer is formed of tempered glass.

4. The device of claim 3, wherein the transparent protection layer has a thickness that is less than or equal to 100 μm.

5. The device of claim 2, wherein each of the first and second guide members comprises a plurality of rollers that are arranged along the length direction.

6. The device of claim 5, wherein the rollers protrude from the front side of the body in the depth dimension of the terminal device.

7. The device of claim 2, wherein each of the first and second guide members comprises a projection which is disposed at one end of the front side of the body and protrudes from the front side of the body in the depth dimension of the terminal device, and a guide portion which extends in the length direction and guides the projection to move along the length direction.

8. The device of claim 2, further comprising:
a scattering prevention portion disposed at one end of the front side of the body and extending in a width direction of the body, wherein the scattering prevention portion protrudes from the front side of the body in the depth dimension of the terminal device.

9. The device of claim 2, wherein the body and the flexible display are foldable anywhere along the front side of the body.

10. A foldable portable terminal device comprising:
a flexible display configured to display an image;
a foldable body accommodating the flexible display on a front side thereof, wherein a first region of the foldable body is configured to be folded so as to face a second region of the foldable body;
a foldable transparent protection layer which is disposed on a front side of the flexible display and formed of tempered glass; and
a scattering prevention portion disposed at a lower end of the front side of the body and extending in a width direction of the body, wherein the scattering prevention portion protrudes from the front side of the body in the depth dimension of the terminal device, and wherein the scattering prevention portion has a thickness smaller than a gap between the first region and the second region such that the scattering prevention portion does not contact the flexible display.

11. The device of claim 10, wherein the transparent protection layer has a thickness that is less than or equal to 100 μm.

12. The device of claim 10, further comprising:
first and second guide members disposed on opposing sides of the flexible display, wherein the first and second guide members are disposed on the front side of the body and extend in a length direction of the body, wherein a first region of the body is configured to be folded so as to face a second region of the body, and wherein the first and second guide members are configured to guide an end of the first region to move in the length direction of the body while maintaining a predetermined interval with respect to the second region.

13. The device of claim 12, wherein the rollers protrude from the front side of the body in the depth dimension of the terminal device.

14. The device of claim 12, wherein each of the first and second guide members comprises a projection which is disposed at one end of the front side of the body and protrudes from the front side of the body in the depth dimension of the terminal device, and a guide portion which extends in the length direction of the body and guides the projection to move along the length direction.

15. The device of claim 10, wherein the body and the flexible display are foldable anywhere along the front side of the body.

16. The device of claim 12, wherein each of the first and second guide members comprises a plurality of rollers that are arranged along the length direction of the body.

17. A foldable portable terminal device comprising:
a flexible display panel;
a foldable body accommodating the flexible display panel on a front side thereof; and
first and second guide members disposed on opposing sides of the flexible display panel, wherein the first and second guide members are disposed on the front side of the body and extend in a length direction of the body,
wherein a first region of the body is configured to be folded so as to face a second region of the body, wherein an end of the first region does not contact the second region when the first region of the body is folded toward the second region, and
wherein the flexible display, the foldable body and the guide members are configured to be folded together.

18. The device of claim 17, wherein the end of the first region extends in the depth dimension of the terminal device.

19. The device of claim 17, wherein the first and second guide members are configured to guide the end of the first region to move in the length direction.

20. The device of claim 17, wherein each of the first and second guide members comprises a plurality of rollers that are arranged along the length direction.

* * * * *